United States Patent [19]

Farrier et al.

[11] Patent Number: 4,782,028

[45] Date of Patent: Nov. 1, 1988

[54] PROCESS METHODOLOGY FOR TWO-SIDED FABRICATION OF DEVICES ON THINNED SILICON

[75] Inventors: Michael G. Farrier; James M. Myrosznyk, both of Santa Barbara, Calif.

[73] Assignee: Santa Barbara Research Center, Goleta, Calif.

[21] Appl. No.: 89,786

[22] Filed: Aug. 27, 1987

[51] Int. Cl.⁴ .......................................... H01L 21/306
[52] U.S. Cl. ........................................ 437/3; 437/203; 437/226
[58] Field of Search ............... 437/3, 5, 2, 974, 906, 437/905, 916, 23, 967, 226, 203, 901, 927, 958, 55; 156/644, 657, 662, 629, 645; 148/DIG. 48, DIG. 135; 357/17, 19, 29, 30, 31

[56] References Cited

U.S. PATENT DOCUMENTS

| 3,332,137 | 7/1967 | Kenney | 437/974 |
|---|---|---|---|
| 3,671,338 | 12/1969 | Fujii | 437/974 |
| 3,841,928 | 10/1974 | Takemoto et al. | 437/916 |
| 3,878,008 | 4/1975 | Gleason et al. | 437/183 |
| 3,914,136 | 10/1975 | Kressel | 437/916 |
| 3,959,037 | 5/1976 | Gutierrez et al. | 437/916 |
| 3,959,038 | 5/1976 | Gutierrez et al. | 437/916 |
| 3,971,860 | 7/1976 | Broers et al. | 437/974 |
| 3,972,750 | 8/1976 | Gutierrez et al. | 437/916 |
| 3,981,023 | 9/1976 | King et al. | 437/23 |
| 4,038,580 | 7/1977 | Porret | 357/55 |
| 4,051,507 | 9/1977 | Rosvold | 357/55 |
| 4,180,422 | 12/1979 | Rosvold | 357/55 |
| 4,257,061 | 3/1981 | Chapel, Jr. et al. | 357/55 |
| 4,277,793 | 7/1981 | Webb | 357/30 D |
| 4,374,390 | 2/1983 | Lee | 357/55 |
| 4,400,869 | 8/1983 | Wilner et al. | 437/974 |
| 4,521,798 | 6/1985 | Baker | 357/55 |
| 4,528,418 | 7/1985 | McGill | 357/30 L |
| 4,543,266 | 9/1985 | Matsuo et al. | 437/974 |
| 4,613,891 | 9/1986 | Ng et al. | 357/55 |
| 4,672,221 | 7/1987 | Saito et al. | 357/30 L |
| 4,691,244 | 9/1987 | Cannella et al. | 357/30 L |

FOREIGN PATENT DOCUMENTS 0170576 10/1982 Japan .
0162463 10/1982 Japan .

*Primary Examiner*—Brian E. Hearn
*Assistant Examiner*—Beverly A. Pawlikowski
*Attorney, Agent, or Firm*—W. C. Schubert; V. G. Laslo; A. W. Karambelas

[57] ABSTRACT

A method is disclosed for forming a detector device, such as a thinned bulk silicon blocked impurity transducer infrared detector, by thinning a semiconductor substrate (10) and processing the thinned region (30) on two sides to form the detector device. The semiconductor substrate (10) is thinned to form a cavity (26) in the substrate (10). Further processing on both sides of the thinned region (30) is performed while the thinned region is still connected to the thicker substrate. The thinned region (30) is then separated from the substrate (10) upon completion of the given processing steps. The device is then mounted to a readout device (58).

15 Claims, 2 Drawing Sheets

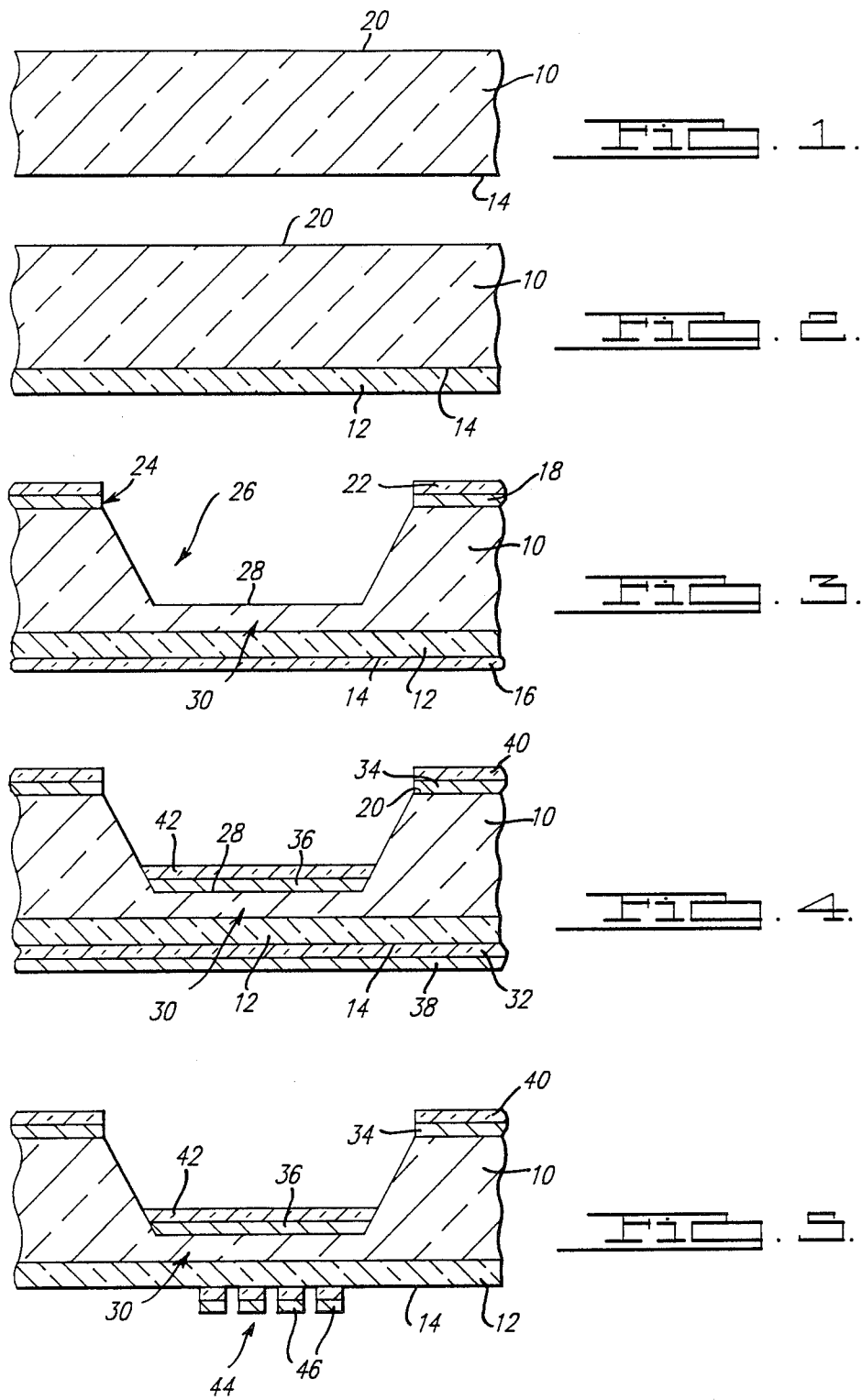

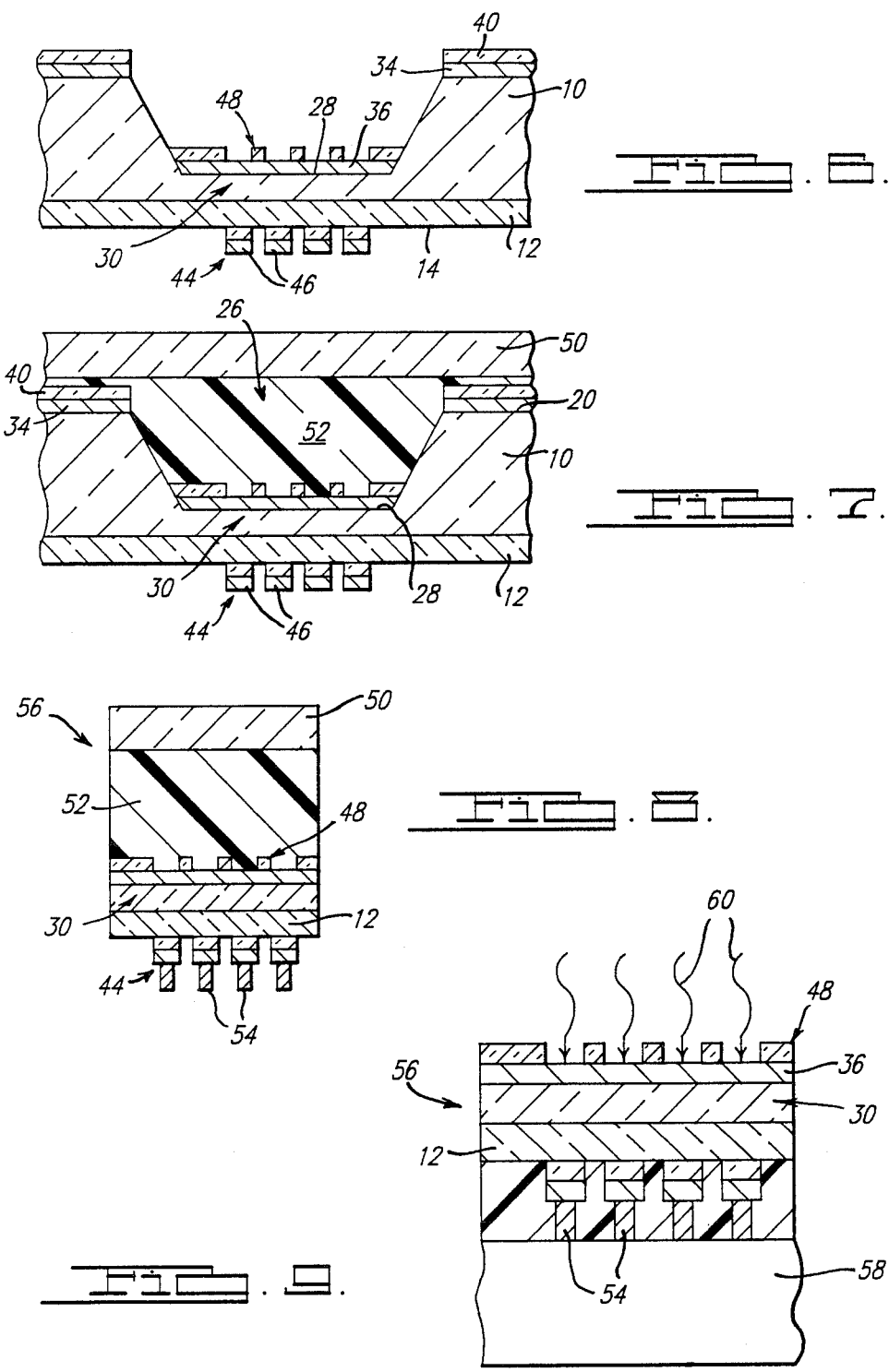

PROCESS METHODOLOGY FOR TWO-SIDED FABRICATION OF DEVICES ON THINNED SILICON

BACKGROUND OF THE INVENTION

1. Technical Field

This invention relates to the fabrication of semiconductor detector devices. More particularly, it relates to a method of utilizing selective thinning techniques and two-sided wafer processing to define a detector device.

2. Background

Thinned semiconductor detector devices are currently gaining wide acceptance in a variety of applications, particularly in applications requiring reduced detector volume to optimize radiation hardness characteristics. Performance characteristics of these devices generally depend on a number of factors including: uniform ohmic contacts over detector surfaces, well defined photosite aperture, and reliable ohmic contact of the detector bias wire bound to the light shield side of the detector. To achieve such high performance characteristics in detector devices, production methods require the ability to easily handle a thinned semiconductor substrate so that high temperature processes such as furnace annealing, photolithographic processing, and metal vapor deposition can easily be applied to both sides of the thinned device. Unfortunately, it has been extremely difficult to perform two-sided processing on thinned semiconductor substrates to fabricate these detector devices.

In recent years, the conventional approach to fabricating thinned detector devices has been to process one side of the device, attach the substrate to a support, mechanically thin the opposite side of the device, and complete processing of the device on the thinned side. That method has typically been approached by first implanting ions, annealing the implanted layer and depositing the patterning aluminum and indium bump layers to form part of the detector on a silicon substrate material. The processed surface of the substrate is then encapsulated to protect it during subsequent processing. The substrate is then attached to a silicon backing wafer to cover the processed side of the substrate. The backing wafer is then used as a means for handling the substrate during a subsequent thinning process. Thinning is achieved by lapping and then chemically polishing the substrate to a desired uniform thickness. With the backing wafer still attached, the thinned surface of the substrate is further processed to complete the detector device.

Unfortunately, this technique has several drawbacks. In particular, the presence of a backing wafer throughout most of the processing stages severely limits processing after the substrate has been thinned. In particular, the presence of the backing wafer does not generally allow for high temperature processes to be applied to the device. As known, many routine silicon processes, such as implant annealing and metal sintering are conducted at high temperatures. Consequently, under this technique, implants have required laser surface annealing, which tends to produce poor implant annealing characteristics. Such characteristics include the formation of nonuniform contact resistances, which can harm the performance of the detector. Additionally, the presence of the backing wafer does not readily permit fabrication of a light shield, which is normally used in these infrared detector devices. Finally, upon detachment of the backing wafer, the resultant fragile thinned device has posed handling risks during hybridization processes. The result of the foregoing has been low yield statistics of performing devices.

The use of chemical etching techniques has been recorded in the literature as an alternative means for thinning semiconductor substrates. See, for example, Varker et al., "Preparation of Large-Area, Electron-Transparent Silicon Specimens by Anisotropic Etching", *Solid State Technology*, April, 1983, pg. 143. However, the literature does not provide a teaching as to how to overcome one or more of the problems discussed above.

SUMMARY OF THE INVENTION

Pursuant to the present invention, a method is disclosed for making a semiconductor detector device having a thinned region from a semiconductor substrate of larger thickness. The method includes the steps of forming a cavity in the original substrate to provide a thinned region therein. A detector device is then processed on the thinned region while the thinned region is still connected to the thicker substrate. The thinned region is then separated from the thicker substrate upon completion of the processing steps. After separating the thinned region from the substrate, it can be mounted to a readout device.

Among the advantages of the present invention is that conventional silicon wafer processing techniques can now be readily utilized on both sides of thinned silicon detectors, as well as at elevated temperatures. This provides a very important commercial advantage since two-sided device fabrication increases production yield and improves the performance of detector devices.

BRIEF DESCRIPTION OF THE DRAWINGS

The various advantages of the present invention will become apparent to one skilled in the art by reading the following specification and by reference to the drawings in which:

FIGS. 1 through 8 are cross-sectional views of the detector device during various steps in the fabrication process; and FIG. 9 is a cross-sectional view of a completed hybridized detector device made in accordance with the teachings of this invention.

DESCRIPTION OF THE PREFERRED EMBODIMENT

For ease of description, the method of this invention will be described in connection with preparing but one blocked impurity transducer infrared detection device. However, it should be realized that in production many detector devices can be produced simultaneously as part of a wafer, as is well known in semiconductor technology. Substrate 10 in FIG. 1 represents a portion of such a wafer. As will be described, substrate 10 serves as a support for the thinned region to be formed for the detector device. Preferably, substrate 10 is a bulk float zone refined extrinsic silicon detector material having a thickness of about 20 mils. It is preferred that substrate 10 is doped with gallium to form a P-type semiconductor having a preferred dopant concentration of 2 to $5 \times 10^{17}$ atoms/cm$^3$. If desired, other dopants such as arsenic, phosphorus, antimony, bismuth, boron, aluminum and indium may be used.

Referring to FIG. 2 an epitaxial layer 12 of extrinsic silicon is grown on the surface 14 of the substrate 10 by chemical vapor deposition. The epitaxial layer is required to provide a "blocking layer" for the operation of a blocked impurity transducer detector. It is preferred that the epitaxial layer 12 is doped with gallium to yield a net acceptor concentration of less than $5 \times 10^{15}$ atoms/cm$^3$ so as to form a P-minus type layer. Other dopant materials can be used in the epitaxial layer and include arsenic, phosphorus, antimony, bismuth, boron, aluminum and indium. Oxide layers 16 and 18 are then grown to a thickness of about 1000 angstroms on surface 14 and an opposite major surface 20 of the substrate for the purpose of protecting the substrate 10 from stress induced by the subsequent silicon nitride layer deposition. Preferably, the oxide is grown by thermally exposing the substrate to oxygen bubbled through water heated to approximately 920 degrees centigrade and about one atmosphere.

An etch-resistant maskant layer 22 of silicon nitride is then coated on the oxide layer 18 to protect regions in the substrate 10 from subsequent silicon etch. The nitride layer 22 should have a thickness of about 2000 angstroms. The nitride layer 22 is applied by low pressure chemical vapor deposition at about 790 degrees centigrade and about 450 milli-TORR. To help prevent etching through the mask and resultant etch pits in undesired regions of the silicon substrate, it is preferred silicon nitride be used as a maskant material, and that the silicon nitride layer be of high quality and free from surface inclusions. Other maskant materials, however, such as aluminum for plasma etching of the silicon, can be substituted for silicon nitride. Using standard photolithographic techniques, the silicon nitride and oxide layers are selectively removed to open a window 24 therein.

Referring now to FIG. 3, after a window has been opened, potassium hydroxide etchant is applied through the window to selectively remove silicon in the substrate to form a cavity 26 within the substrate. The etching process is typically performed by immersing a horizontally held silicon substrate in a potassium hydroxide solution that is heated to about 90 degrees centigrade. The substrate remains immersed in the potassium hydroxide solution for 2-4 hours, while the solution is agitated throughout that period. The etchant rate is predetermined to form a surface 28 parallel to the surface 14 and spaced therefrom by a given distance. The resultant thinned region 30 between the surfaces 14 and 28 will be used as the detector. It is preferred that the thinned region 30 have a thickness greater than or equal to 0.001 inch and less than or equal to 0.002 inches. The preferred etchant is potassium hydroxide, because it readily etches the silicon substrate but does not readily attack the intermediate silicon dioxide and silicon nitride layers. It is recognized, however, that other etchants can be used such as hydrofluoric acid plus nitric acid, hydrofluoric acid plus nitric acid plus acetic acid, and hydrofluoric acid plus nitric acid plus acetic acid plus iodine. Upon completion of the etching process, the silicon nitride mask 22 and silicon dioxide layers 16, 18 are removed. The preferred method of removal is to expose the mask and oxide layers to phosphoric acid at about 155 degrees centigrade for approximately 1 hour followed by a buffered hydrofluoric acid etch, until the oxide layer is cleared. Another method of removal requires that the silicon nitride mask 22 be plasma etched in carbon tetrafluoride gas at about 250 milli-TORR and about 200 watts for approximately one hour, followed by a hydrofluoric acid etch to clear the silicon dioxide layer.

Referring now to FIG. 4, ions are implanted on the surfaces to form implanted layers 32, 34 and 36 on surfaces 14, 20 and 28, respectively of a given P-plus dopant concentration. These implanted layers will serve as part of the electrodes in the completed detector device. While boron ions are preferably implanted to form these layers, it should be appreciated that other ions can also provide an effective implanted layer.

The implanted layers are then annealed at high temperature using a conventional furnace anneal or a rapid thermal anneal. Because no backing wafer is present during annealing, laser annealing is not required, thereby allowing for improved implant annealing characteristics. Thin metallic layers 38, 40 and 42 are then sputtered onto the implanted layers 32, 34 and 36, respectively. The preferred metal for the contacts to be formed is aluminum, which is sputtered at a substrate temperature of approximately 200 degrees centigrade. The resultant metallic layers should be about 1 micron in thickness. It is recognized that other metals such as platinum, palladium and tungsten can be used to form the metallic contacts.

Referring now to FIG. 5, electrodes (generally designated by the numeral 44) are formed on surface 14 from layers 32 and 38. To form contacts 46 for electrodes 44, standard photolithographic techniques are employed to apply photoresist material except on selected areas on layer 38 leaving photoresist material only where a plurality of contacts are desired. With the photoresist material as a maskant, the layer 38 is etched to remove only the aluminum thereby forming a plurality of metal contacts 46 on the surface 32 opposite surface 36. While it is preferred that phosphoric acid-based commercial aluminum etch be used, other suitable etchants that will attack only the metal surface can be used and include a plasma etch in carbon tetrachloride. With the contacts 46 defined, the remaining photoresist material is removed. The remaining aluminum contacts then act as a mask for etching of the surface 32 to complete the formation of a plurality of electrodes 44. The surface 32 is then etched to a depth of 1.0-2.0 microns into surface 14, thereby isolating detector contacts from each other. It is preferred that the surface 32 be reactive ion etched in nitrogen trifluoride gas at about 100 watts for approximately 10 minutes, at a pressure of about 15 milli-Torr. While it is preferred that the contacts consist of an outer metallic layer and an implant layer, other electrode configurations can be used.

Referring now to FIG. 6, the infrared detector device is completed by selectively removing aluminum from layer 42 in areas opposite the electrode contacts 46 to form a light shield 48 in the areas between the contacts. The light shield acts to reflect radiation incident to the surface 28. The light shields are formed by first applying photoresist material to the aluminum layer 42. The photoresist is then subjected to projection lithography techniques wherein special adjustment of the focal plane in the projection optics of the aligner allow for well resolved exposure of photoresist in the projected pattern. The photoresist material is removed to define a pattern for the light shields which positions the light shield over the surface 28 opposite the gaps between the contacts 46 on the surface 14. After the photoresist material is removed, the aluminum in the layer 42 is etched using phosphoric acid based commercial aluminum etchant at 45 degrees centigrade to form the resulting light shield 48. Prior to this invention, light shields of the above-described type have not been readily formable.

The remaining processing steps preferably employ the aid of a silicon backing wafer for handling purposes. FIG. 7 shows such a backing wafer 50 which is preferably made of silicon material. Prior to attaching backing wafer 50 an adhesive/filler 52 is applied onto the layer 40 and into the cavity 26. While it is preferred that the adhesive/filler be "Crystal Bond" brand thermoplastic polymer, it is appreciated that other polymeric adhesive fillers such as "Wevo" brand wax, polyimide, and various epoxies are suitable for this purpose. The backing wafer 50 is attached to the substrate 10 with the adhesive.

As shown in FIG. 8, indium bumps 54 are then formed on the contacts 46 of the electrodes 44 to form electrical contacts to the input circuit of a subsequently hybridized readout device. These bumps are formed by applying photoresist, photolithographically exposing a pattern which leaves photoresist on all regions of surface 14 and contacts 44 and 46 except where indium is to remain. Indium is then evaporated over the photoresist and contacts. The combined photoresist and indium layers are then lifted off of the surface 14 using acetone. Indium remains only on contacts 46.

Upon forming the indium bumps 54, individual chips 56 are separated from the thicker substrate using conventional separation techniques. It is preferred that the separation employ sawing the individual chips. The resulting chips 56 have a uniform thickness which can be less than 0.002 inches in the thinned region 30, exclusive of the contacts and light shield. Upon completion of the sawing, the backing wafer 50 and adhesive/filler 52 is removed from the detector device by soaking in acetone. The completed device, as shown in FIG. 9, is hybridized to a conventional read-out device 58. It is recognized that various designs of read-out devices are used for transferring the electrical characteristics created in chip 56 from incident infrared radiation 60.

It should be understood that while this invention has been described in connection with one presently preferred example that other modifications will be apparent to those skilled in the art after a study of the specification, drawings and following claims.

What is claimed is:

1. A method of forming a detector device having a thinned region from a semiconductor substrate of larger thickness defined by first and second major surfaces, said method comprising the steps of:
    (a) forming a cavity in the substrate substrate to provide a thinned region therein having a third surface generally parallel to the first surface;
    (b) implanting ions to form implanted layers of a given dopant concentration on the first, second and third surfaces;
    (c) annealing the substrate and implanted layers;
    (d) depositing metal onto the implanted layers of the first, second and third surfaces;
    (e) selectively removing metal and portions of the implanted layer to form a plurality of contacts on the first surface;
    (f) selectively removing metal from the third surface in areas opposite the contacts to form a light shield in the areas between the contacts; and
    (g) separating the thinned region from the substrate whereby the processing of the thinned region can easily be performed on two sides prior to mounting it to a readout device.

2. The method of claim 1 wherein the cavity is formed in the substrate by etching the substrate.

3. The method of claim 1 wherein the substrate is silicon and it is etched in a solution of potassium hydroxide.

4. The method of claim 1 wherein the substrate and implanted layers are annealed.

5. The method of claim 1 wherein the metal that is deposited onto the implanted layers of the first, second and third surfaces is aluminum.

6. A method for two-sided fabrication of infrared detector devices on a silicon substrate, said method comprising the steps of:
    (a) growing an epitaxial layer on a first surface of the substrate, said epitaxial layer having a different dopant concentration than the substrate;
    (b) thermally oxidizing the substrate to form oxide layers on the first surface and an opposite second surface of the substrate;
    (c) coating the oxide layers with a maskant layer of silicon nitride;
    (d) photolithographically opening a window in the maskant on the second surface;
    (e) etching the substrate through the window to form a third surface parallel to the first surface and spaced therefrom by a given distance thereby forming a thinned region for use as the detector;
    (f) removing the maskant;
    (g) implanting ions to form implanted layers of a given dopant concentration on the first, second and third surfaces;
    (h) annealing the substrate and implanted layers;
    (i) depositing aluminum onto the implanted layers of the first, second and third surfaces;
    (j) selectively removing portions of the implanted layer and aluminum to form a plurality of contacts on the first surface opposite the third surface;
    (k) selectively removing aluminum from the third surface in areas opposite the contacts to form a light shield in the areas between the contacts;
    (k) applying adhesive into the cavity defined by the area between the second and third surfaces and onto the second surface;
    (l) attaching a backing wafer to the second surface;
    (m) forming indium bumps on the contacts;
    (n) separating the thinned region from its adjacent thicker substrate to form individual chips of the thinned region containing the contacts and light shield;
    (o) removing the adhesive and backing wafer; and
    (p) attaching the chip to a readout device whereby the processing of the thinned device can easily be performed on two sides prior to mounting it to the readout device.

7. The method of claim 1 wherein the substrate and implanted layers are annealed using a rapid thermal anneal.

8. The method of claim 1 wherein the metal is removed from the third surface in areas opposite the contacts to form a light shield in areas between the contacts using projection lithography techniques.

9. The method of claim 1 wherein boron ions are implanted to form implanted layers on the first, second and third surfaces.

10. The method of claim 6 wherein the epitaxial layer is grown by chemical vapor deposition.

11. The method of claim 6 wherein the substrate is etched in a solution of potassium hydroxide.

12. The method of claim 6 wherein the ions implanted to form implanted layers are boron ions.

13. The method of claim 6 wherein the substrate and implanted layers are annealed using a conventional furnace anneal.

14. The method of claim 6 wherein the substrate and implanted layers are annealed using a rapid thermal anneal.

15. The method of claim 6 wherein the aluminum is removed from the third surface in areas opposite the contacts to form a light shield in the areas between the contacts using projection lithography techniques.

* * * * *